(12) United States Patent
Sun et al.

(10) Patent No.: US 10,381,343 B2
(45) Date of Patent: Aug. 13, 2019

(54) ELECTROSTATIC PROTECTION DEVICE OF LDMOS SILICON CONTROLLED STRUCTURE

(71) Applicant: CSMC TECHNOLOGIES FAB2 CO., LTD., Jiangsu (CN)

(72) Inventors: Jun Sun, Jiangsu (CN); Zhongyu Lin, Jiangsu (CN); Guangyang Wang, Jiangsu (CN); Guipeng Sun, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 15/569,848

(22) PCT Filed: Apr. 29, 2016

(86) PCT No.: PCT/CN2016/080590
§ 371 (c)(1),
(2) Date: Oct. 27, 2017

(87) PCT Pub. No.: WO2016/173520
PCT Pub. Date: Nov. 3, 2016

(65) Prior Publication Data
US 2018/0122794 A1 May 3, 2018

(30) Foreign Application Priority Data
Apr. 29, 2015 (CN) .......................... 2015 1 0213256

(51) Int. Cl.
*H01L 27/02* (2006.01)
*H01L 29/78* (2006.01)
(Continued)

(52) U.S. Cl.
CPC ........ *H01L 27/0262* (2013.01); *H01L 29/402* (2013.01); *H01L 29/7817* (2013.01); *H01L 29/87* (2013.01)

(58) Field of Classification Search
CPC .................................................. H01L 29/7816
See application file for complete search history.

(56) References Cited

U.S. PATENT DOCUMENTS 8,890,259 B2 * 11/2014 Dai ...................... H01L 27/0623
257/107
2009/0267147 A1 * 10/2009 De Boet ............. H01L 27/0266
257/337
(Continued)

FOREIGN PATENT DOCUMENTS

CN 1433083 A 7/2003
CN 1841744 A 10/2006
(Continued)

OTHER PUBLICATIONS

International Search Report dated Aug. 2, 2016 issued in corresponding International Application No. PCT/CN2016/080590, 5 Pages.

*Primary Examiner* — Thao P Le
(74) *Attorney, Agent, or Firm* — Polsinelli PC

(57) ABSTRACT

An electrostatic protection device of an LDMOS silicon controlled structure comprises a P-type substrate (310), an N-well (320) and a P-well (330) on the substrate, a gate electrode (340) overlapping on the P-well (330) and extending to an edge of the N-well (320), a first N+ structure and a first P+ structure provided in the N-well (320), and a second N+ structure and a second P+ structure provided in the P-well (330), the first N+ structure being a drain electrode N+ structure (322), the first N+ structure being a drain electrode N+ structure (322), the first P+ structure being a drain electrode P+ structure (324), the second N+ structure
(Continued)

being a source electrode N+ structure (332), the second P+ structure being a source P+ structure (334), and a distance from the drain electrode P+ structure (324) to the gate electrode (340) being greater than a distance from the drain electrode N+ structure (322) to the gate electrode (340).

20 Claims, 4 Drawing Sheets

(51) Int. Cl.
*H01L 29/87* (2006.01)
*H01L 29/40* (2006.01)

(56) References Cited

U.S. PATENT DOCUMENTS

| | | | |
|---|---|---|---|
| 2011/0039378 A1* | 2/2011 | Voldman | H01L 29/66659 |
| | | | 438/200 |
| 2013/0099278 A1* | 4/2013 | Dai | H01L 27/0623 |
| | | | 257/133 |
| 2018/0122794 A1* | 5/2018 | Sun | H01L 27/02 |

FOREIGN PATENT DOCUMENTS

| | | |
|---|---|---|
| CN | 101339956 A | 1/2009 |
| CN | 103258814 A | 8/2013 |
| CN | 103617996 A | 3/2014 |
| CN | 103681660 A | 3/2014 |

* cited by examiner

US 10,381,343 B2

ELECTROSTATIC PROTECTION DEVICE OF LDMOS SILICON CONTROLLED STRUCTURE

CROSS REFERENCE TO RELATED APPLICATIONS

This application is a National Phase filing under 35 U.S.C. § 371 of PCT/CN2016/080590 filed on Apr. 29, 2016, and this application claims priority to Chinese Application No. 201510213256.5 filed on Apr. 29, 2015. The entire contents of each application are hereby incorporated by reference.

FIELD OF THE INVENTION

The present disclosure relates to a field of electrostatic discharge (ESD) protection device, and more particularly relates to an electrostatic protection device of an LDMOS silicon controlled structure.

BACKGROUND OF THE INVENTION

With the application of high voltage device in integrated circuit wider and wider, the requirement of antistatic ability for the high voltage device is higher and higher. Most of the conventional external antistatic devices are implemented using silicon controlled structure (SCR), and characteristics of the structure vary with the different process.

A conventional LDMOS-SCR electrostatic protection structure has a deficiency that it is easy to cause a punch through between a drain terminal (i.e., P+ of an anode) and a source terminal (i.e., a high voltage P-well of a cathode), such that an internal circuit is easy to be affected, thereby resulting in breakdown voltage (BV) decreased, and a working voltage cannot meet the original design.

SUMMARY OF THE INVENTION

Therefore, it is necessary to provide an electrostatic protection device of an LDMOSLDMOS silicon controlled structure, which can ensure a higher breakdown voltage (BV).

An electrostatic protection device of an LDMOS silicon controlled structure includes a P-type substrate; an N-well and a P-well on the substrate; a gate overlapping the P-well and extending to an edge of the N-well; a first N+ structure and a first P+ structure provided in the N-well; a second N+ structure and a second P+ structure provided in the P-well; the first N+ structure is a drain N+ structure, the first P+ structure is a drain P+ structure; the second N+ structure is a source N+ structure, the second P+ structure is a source P+ structure; a distance from the drain P+ structure to the gate is greater than a distance from the drain N+ structure to the gate.

An electrostatic protection device of an LDMOSLDMOS silicon controlled structure includes a substrate; a P-type epitaxial layer on the substrate; an N-well and a P-well on the P-type epitaxial layer; a gate overlapping the P-well and extending to an edge of the N-well; a first N+ structure and a first P+ structure provided in the N-well; a second N+ structure and a second P+ structure provided in the P-well; the first N+ structure is a drain N+ structure, the first P+ structure is a drain P+ structure; the second N+ structure is a source N+ structure, the second P+ structure is a source P+ structure; a distance from the drain P+ structure to the gate is greater than a distance from the drain N+ structure to the gate.

According to the aforementioned electrostatic protection device of the LDMOS silicon controlled structure, the distance from the drain P+ structure to the gate is greater than the distance from the drain N+ structure to the gate, thus it is difficult to form a punch through, so that the BV can be maintained at a design level.

BRIEF DESCRIPTION OF THE DRAWINGS

The above objects, features and advantages of the present disclosure will become more apparent by describing in detail embodiments thereof with reference to the accompanying drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

Embodiments of the invention are described more fully hereinafter with reference to the accompanying drawings, some embodiments of the present disclosure are shown in the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the present disclosure to those skilled in the art.

Unless otherwise defined, all terms (including technical and scientific terms) used herein have the same meaning as commonly understood by one of ordinary skill in the art to which this invention belongs. The terminology used herein is for the purpose of describing particular embodiments only and is not intended to be limiting of the invention. It will be further understood that the term "and/or" is understood to encompass various alternative orientations.

In the conventional technology, a distance from P+ of a drain (i.e. an anode) to a polysilicon gate is less than a distance from N+ of the drain to the polysilicon gate, then a breakdown voltage (BV) will be affected. Since the high voltage (HV) N-well is completely depleted, when the distance from P+ of the drain to the polysilicon gate is less than or equal to the distance from N+ of the drain to the polysilicon gate, a punch through will be formed and the BV will be decreased, and a working voltage cannot meet the original design.

Figure 1:
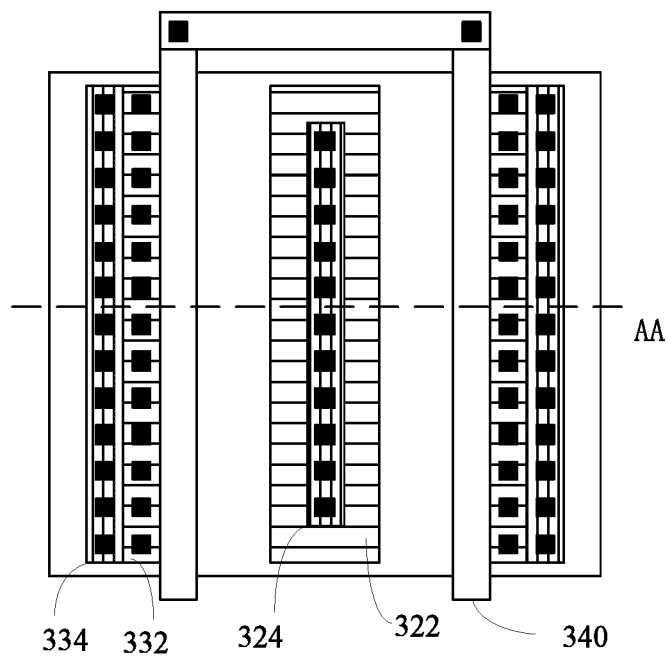
FIG. 1 is a layout of an electrostatic protection device of an LDMOS silicon controlled structure (SCR) according to an embodiment.
Figure 2:
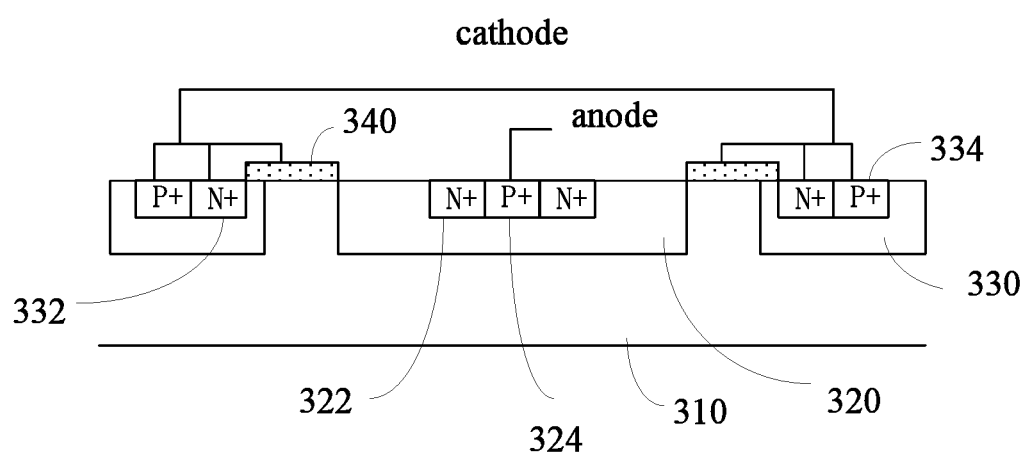
FIG. 2 is a sectional view of the electrostatic protection device of the LDMOS-SCR taken along line AA of FIG. 1.

FIG. 1 is a layout of an electrostatic protection device of an LDMOS silicon controlled structure (SCR) according to an embodiment, and FIG. 2 is a sectional view of the electrostatic protection device of the LDMOS-SCR taken along line AA of FIG. 1.

In the illustrated embodiment, the LDMOS silicon controlled structure is a common-drain structure. The LDMOS silicon controlled structure includes a N-well 320, a drain N+ structure 322, a the drain P+ structure 324, which are located in the middle. The LDMOS silicon controlled structure further includes two P-wells 330, two source N+ structures 332, and two source P+ structures 334, which are respectively provided on both sides of the N-well 320. As shown in FIG. 1, the N-well 320 overlaps the P-well on both sides thereof via a gate 340 extending to an edge of the source N+ structure 332 of a corresponding side, and the drain P+ structure 324 is surrounded by the drain N+ structure 322 from four sides in a horizontal direction. In the illustrated embodiment, the N-well 320 is a high voltage N-well, and the P-well 330 is a high voltage P-well.

In an alternative embodiment, the N-well 320 and the P-well 330 can be formed in a P-type epitaxial layer, i.e., the P-type epitaxial layer is located in a position of a P-type substrate 310 in FIG. 2.

According to the aforementioned electrostatic protection device of the LDMOS-SCR, a distance from the drain P+ structure 324 to the gate 340 is greater than a distance from the drain N+ structure 322 to the gate 340, thus it is difficult for drain P+ structure 324 of the anode and the P-well 330 to form the punch through, so that the BV can be maintained at a design level.

In the illustrated embodiment, as shown in FIG. 1, the drain P+ structure 320 in the N-well 324 is led out as the anode by a contact hole, and the drain N structure 320 in the N-well 322 is not led out. However, in the conventional technology, the N+ of the drain and the P+ of the drain are both led out, which is equivalent to form a parallel NPN. The NPN is equivalent to a parasitic NPN of a common HV NLDMOS, and the electrostatic discharge (ESD) capability is finally limited on the parasitic NPN. Since the ESD capability of the parasitic NPN is poor, the ESD capability of the device is also poor. However, in the illustrated embodiment, the drain P+ structure 324 is led out only and the drain N+ structure 322 is not led out, such that the parasitic NPN can be avoided, and only a SCR with a PNPN structure is preserved, therefore the ESD capability is improved.

In the illustrated embodiment, the source N+ structures 332 and the source P+ structures 334 in the two P-wells 330 are both led out by the contact hole, and the lead-out are electrically coupled to each other. The two gates 340 are led out by the contact hole and are electrically coupled to each other. Furthermore, the two gates 340 are electrically coupled to the lead-out of the source N+ structure 332 and the lead-out of the source P+ structure 334 as a cathode.

Figure 3:
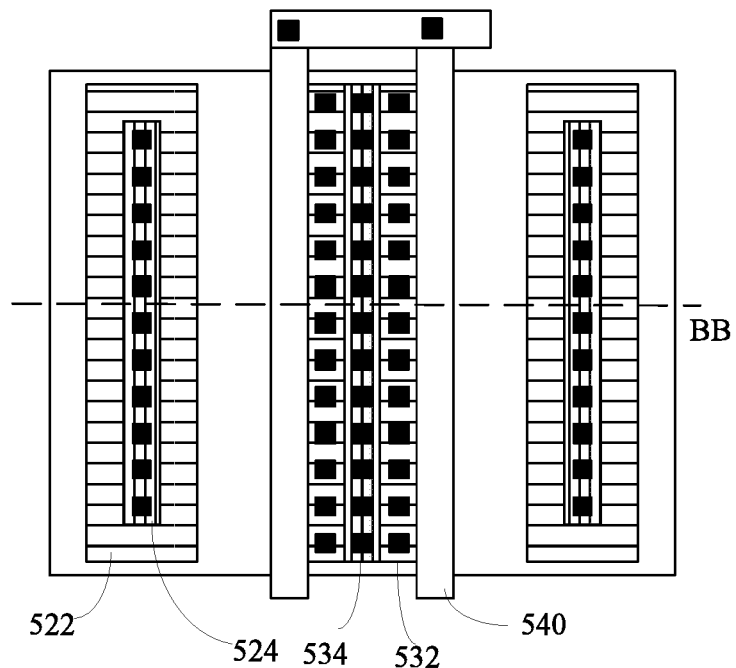
FIG. 3 is a layout of an electrostatic protection device of an LDMOS-SCR according to another embodiment.
Figure 4:
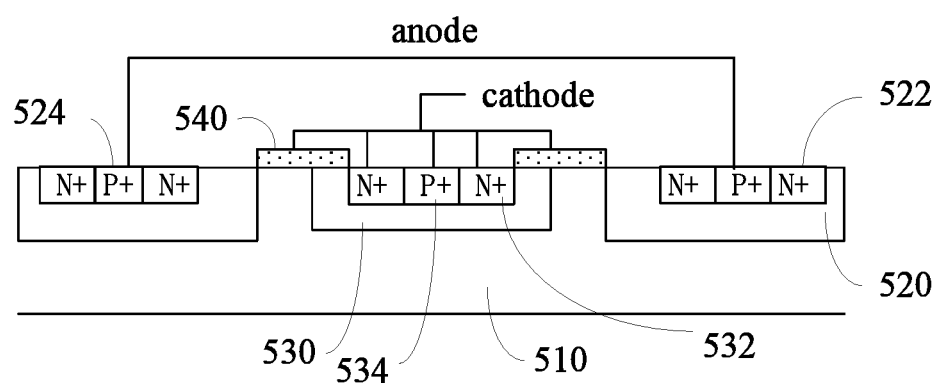
FIG. 4 is a sectional view of the electrostatic protection device of the LDMOS-SCR taken along line BB of FIG. 3.

FIG. 3 is a layout of an electrostatic protection device of an LDMOS-SCR according to another embodiment, and FIG. 4 is a sectional view of the electrostatic protection device of the LDMOS-SCR taken along line BB of FIG. 3.

In the illustrated embodiment, the LDMOS silicon controlled structure is a common-source structure. The LDMOS silicon controlled structure includes a P-well 530, a source N+ structure 532, and a source P+ structure 534, which are located in the middle. The LDMOS silicon controlled structure further includes two N-wells 520, two drain N+ structures 522, and two drain P+ structures 524, which are respectively provided on both sides of the P-well 530. The source N+ structures 532 are provided on both sides of the source P+ structure 534 and are separated by the source P+ structure 534. The two N-wells 520 on both sides of the P-well 530 overlap the P-well 530 via a gate 540 extending to an edge of the source N+ structure 532 of a corresponding side, respectively.

In the illustrated embodiment, the drain P+ structures 524 in the two N-wells 520 on both sides of the P-well 530 are led out by a contact hole and are electrically coupled to each other as an anode. The drain N+ structures 522 in the two N-wells 520 on both sides of the P-well 530 are not led out. The source P+ structure 534 in the P-well 530 is led out by the contact hole. The source N+ structures 532 in the P-well 530 are led out by the contact hole and are electrically coupled to each other. The two gates 540 are led out by the contact hole and are electrically coupled to each other. Furthermore, the two gates 540 are electrically coupled to lead-out of the source N+ structure 532 and lead-out of the source P+ structure 534 as a cathode.

Referring to FIG. 3, in the illustrated embodiment, the drain P+ structure 524 is surrounded by the drain N+ structure 522 from four sides in the horizontal direction.

In an alternative embodiment, the N-well 520 and the P-well 530 can be formed in a P-type epitaxial layer, i.e., the P-type epitaxial layer is located in a position of a P-type substrate 510 in FIG. 4.

Figure 5:
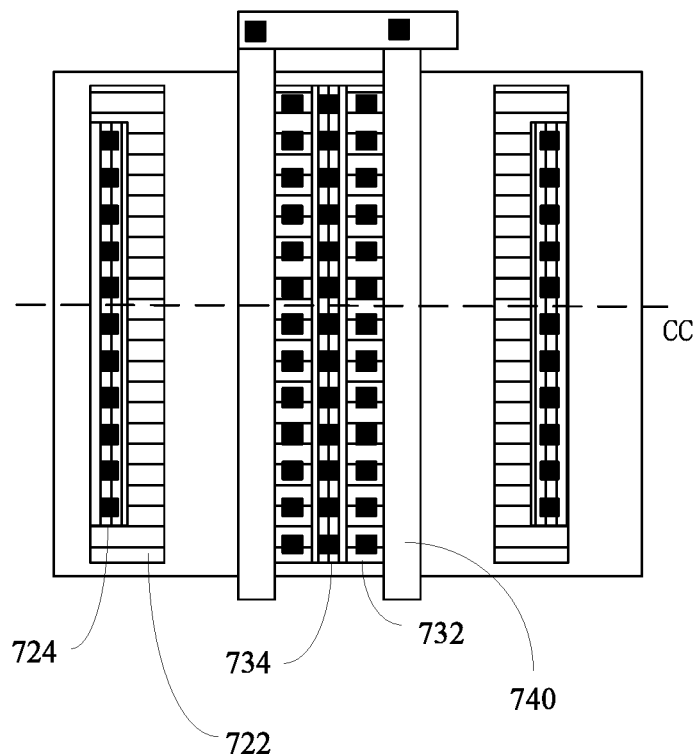
FIG. 5 is a layout of an electrostatic protection device of an LDMOS-SCR according to yet another embodiment.
Figure 6:
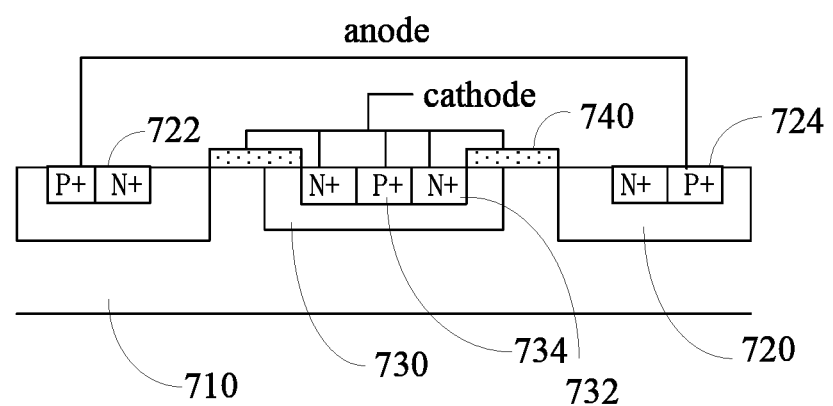
FIG. 6 is a sectional view of the electrostatic protection device of the LDMOS-SCR taken along line CC of FIG. 5.

FIG. 5 is a layout of an electrostatic protection device of an LDMOS-SCR according to yet another embodiment, and FIG. 6 is a sectional view of the electrostatic protection device of the LDMOS-SCR taken along line CC of FIG. 5.

In the illustrated embodiment, the LDMOS silicon controlled structure is also a common-source structure. The LDMOS silicon controlled structure includes a P-well 730, a source N+ structure 732, and a source P+ structure 734, which are located in the middle. The LDMOS silicon controlled structure further includes two N-wells 720, two drain N+ structures 722, and two drain P+ structures 724, which are respectively provided on both sides of the P-well 730. The main difference between the embodiment shown in FIG. 5 and the embodiment shown in FIG. 3 is that, the drain P+ structure 724 is surrounded by the drain N+ structure 722 of the embodiment shown in FIG. 5 from three sides in the horizontal direction, and the drain P+ structure 724 is in contact with the N-well 720 on a side away from the source, directly.

Figure 7:
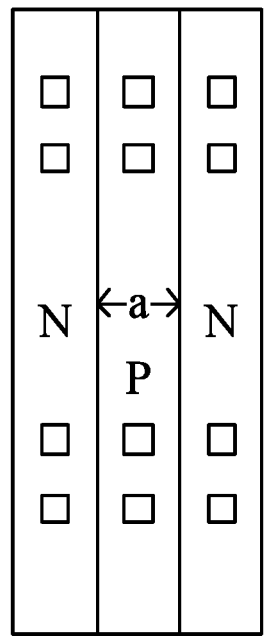
FIG. 7 is a schematic diagram showing a source of the LDMOS-SCR with a common-source structure having 3-stripe shape pickup structures.
Figure 8:
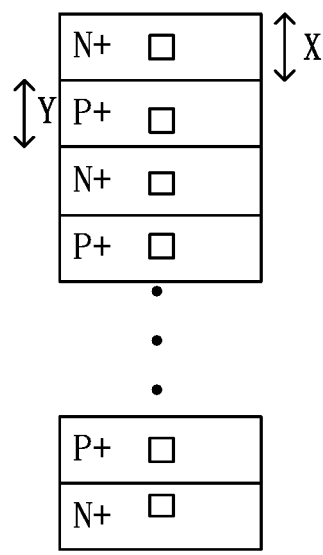
FIG. 8 is a schematic diagram showing a source of the LDMOS-SCR with a common-source structure having multi-segment shape pickup structures.

The sources shown in FIGS. 3 and 5 are 3-stripe shape pickup structures. As shown in FIG. 7, each of N+, P+ and N+ is led out as a stripe, respectively. It should be noted that a width value of a should be adjusted according to an actual requirement of the device. In an alternative embodiment, the sources can be also multi-segment shape pickup structures spaced arranged in the longitudinal direction of N+ and P+ (i.e. a direction being perpendicular to a direction of a connecting line between the two N-wells on both sides of the P-well in the middle). It should pay attention to a ratio of lengths X and Y of N+, P+ in the longitudinal direction directed to the structure.

Similarly, in an alternative embodiment, the P-type substrate 710 can be replaced by a P-type epitaxial layer.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the invention is illustrated and described herein with reference to specific embodiments, the invention is not intended to be limited to the details shown. It should be noted that any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. An electrostatic protection device of an LDMOS silicon controlled structure, comprising: a P-type substrate; an N-well and a P-well on the substrate; a gate overlapping the P-well and extending to an edge of the N-well; a first N+ structure and a first P+ structure provided in the N-well; a second N+ structure and a second P+ structure provided in the P-well; wherein the first N+ structure is a drain N+ structure, the first P+ structure is a drain P+ structure; the second N+ structure is a source N+ structure, the second P+ structure is a source P+ structure; a distance from the drain P+ structure to the gate is greater than a distance from the drain N+ structure to the gate.

2. The electrostatic protection device of the LDMOS silicon controlled structure of claim 1, wherein the drain P+ structure is surrounded by the drain N+ structure at least from three sides in a horizontal direction; an extension of the gate starts from an edge of the source N+ structure adjacent to the N-well and terminates at an edge of the N-well adjacent to the edge of the source N+ structure.

3. The electrostatic protection device of the LDMOS silicon controlled structure of claim 2, wherein the LDMOS silicon controlled structure is a common-drain structure; the LDMOS silicon controlled structure comprises the N-well, the drain N+ structure, and the drain P+ structure, which are located in the middle; and the LDMOS silicon controlled structure further comprises two P-wells, two source N+ structures, and two source P+ structures, which are respectively provided on both sides of the N-well; the N-well overlaps the P-well on both sides thereof via the gate extending to an edge of the source N+ structure of a corresponding side, respectively; the drain P+ structure is surrounded by the drain N+ structure from four sides in the horizontal direction.

4. The electrostatic protection device of the LDMOS silicon controlled structure of claim 3, wherein the drain P+ structure in the N-well is led out by a contact hole, and the drain N+ structure in the N-well is not led out.

5. The electrostatic protection device of the LDMOS silicon controlled structure of claim 3, wherein the source N+ structures and the source P+ structures in the two P-wells are both led out by a contact hole, the two gates are led out by the contact hole; lead-out of the source N+ structures in the two P-wells, lead-out of the source P+ structures in the two P-wells, and lead-out of the two gates are electrically coupled to each other.

6. The electrostatic protection device of the LDMOS silicon controlled structure of claim 2, wherein the LDMOS silicon controlled structure is a common-source structure; the LDMOS silicon controlled structure comprises the P-well, the source N+ structure, and the source P+ structure, which are located in the middle; and the LDMOS silicon controlled structure further comprises two N-wells, two drain N+ structures, and two drain P+ structures, which are respectively provided on both sides of the P-well; the source N+ structures are provided on both sides of the source P+ structure; the two N-wells on both sides of the P-well overlap the P-well via the gate extending to an edge of the source N+ structure, respectively.

7. The electrostatic protection device of the LDMOS silicon controlled structure of claim 6, wherein the drain P+ structures in the two N-wells on both sides of the P-well are both led out by a contact hole and are electrically coupled to each other, and the drain N+ structures in the two N-wells on both sides of the P-well are not led out.

8. The electrostatic protection device of the LDMOS silicon controlled structure of claim 6, wherein the source P+ structure in the P-well is led out by a contact hole, and the source N+ structure in the P-well is led out by the contact hole, the two gates are led out by the contact hole; lead-out of the source P+ structure, lead-out of the source N+ structure, and lead-out of the two gates are electrically coupled to each other.

9. The electrostatic protection device of the LDMOS silicon controlled structure of claim 8, wherein the source N+ structure and the source P+ structure are 3-stripe shape pickup structures of NPN, and each of N+, P+, and N+ is led out as a stripe, respectively.

10. The electrostatic protection device of the LDMOS silicon controlled structure of claim 6, wherein the source N+ structure and the source P+ structure are multi-segment shape pickup structures, which are alternatively arranged in a longitudinal direction.

11. The electrostatic protection device of the LDMOS silicon controlled structure of claim 1, wherein the LDMOS is an N trench LDMOS.

12. An electrostatic protection device of an LDMOS silicon controlled structure, comprising: a substrate; a P-type epitaxial layer on the substrate; an N-well and a P-well on the P-type epitaxial layer; a gate overlapping the P-well and extending to an edge of the N-well; a first N+ structure and a first P+ structure provided in the N-well; a second N+ structure and a second P+ structure provided in the P-well; wherein the first N+ structure is a drain N+ structure, the first P+ structure is a drain P+ structure; the second N+ structure is a source N+ structure, the second P+ structure is a source P+ structure; a distance from the drain P+ structure to the gate is greater than a distance from the drain N+ structure to the gate.

13. The electrostatic protection device of the LDMOS silicon controlled structure of claim 12, wherein the drain P+ structure is surrounded by the drain N+ structure at least from three sides in a horizontal direction; an extension of the gate starts from an edge of the source N+ structure adjacent to the N-well and terminates at an edge of the N-well adjacent to the edge of the source N+ structure.

14. The electrostatic protection device of the LDMOS silicon controlled structure of claim 13, wherein the LDMOS silicon controlled structure is a common-drain structure; the LDMOS silicon controlled structure comprises the N-well, the drain N+ structure, and the drain P+ structure, which are located in the middle; and the LDMOS silicon controlled structure further comprises two P-wells, two source N+ structures, and two source P+ structures, which are respectively provided on both sides of the N-well; the N-well overlaps the P-well on both sides thereof via the gate extending to an edge of the source N+ structure of a corresponding side, respectively; the drain P+ structure is surrounded by the drain N+ structure from four sides in the horizontal direction.

15. The electrostatic protection device of the LDMOS silicon controlled structure of claim 14, wherein the drain P+ structure in the N-well is led out by a contact hole, and the drain N+ structure in the N-well is not led out.

16. The electrostatic protection device of the LDMOS silicon controlled structure of claim 14, wherein the source N+ structures and the source P+ structures in the two P-wells are both led out by a contact hole, the two gates are led out by the contact hole; lead-out of the source N+ structures in the two P-wells, lead-out of the source P+ structures in the two P-wells, and lead-out of the two gates are electrically coupled to each other.

17. The electrostatic protection device of the LDMOS silicon controlled structure of claim 13, wherein the LDMOS silicon controlled structure is a common-source structure; the LDMOS silicon controlled structure comprises the P-well, the source N+ structure, and the source P+ structure, which are located in the middle; and the LDMOS silicon controlled structure further comprises two N-wells, two drain N+ structures, and two drain P+ structures, which are respectively provided on both sides of the P-well; the source N+ structures are provided on both sides of the source P+ structure; the two N-wells on both sides of the P-well overlap the P-well via the gate extending to an edge of the source N+ structure, respectively.

18. The electrostatic protection device of the LDMOS silicon controlled structure of claim 17, wherein the drain P+ structures in the two N-wells on both sides of the P-well are both led out by a contact hole and are electrically coupled to each other, and the drain N+ structures in the two N-wells on both sides of the P-well are not led out.

19. The electrostatic protection device of the LDMOS silicon controlled structure of claim 17, wherein the source P+ structure in the P-well is led out by a contact hole, and the source N+ structure in the P-well is led out by the contact hole, the two gates are led out by the contact hole; lead-out of the source P+ structure, lead-out of the source N+ structure, and lead-out of the two gates are electrically coupled to each other.

20. The electrostatic protection device of the LDMOS silicon controlled structure of claim 19, wherein the source N+ structure and the source P+ structure are 3-stripe shape pickup structures of NPN, and each of N+, P+, and N+ is led out as a stripe, respectively.

\* \* \* \* \*